(12) United States Patent
Higeta (10) Patent No.: US 8,391,436 B2
(45) Date of Patent: Mar. 5, 2013

(54) RECEIVING APPARATUS, TRANSMISSION APPARATUS, AND TRANSMISSION METHOD

(75) Inventor: Masanori Higeta, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 13/067,368

(22) Filed: May 26, 2011

(65) Prior Publication Data

US 2011/0228827 A1    Sep. 22, 2011

Related U.S. Application Data

(63) Continuation of application No. PCT/JP2008/072567, filed on Dec. 11, 2008.

(51) Int. Cl.
| | | |
|---|---|---|
| H04L 7/00 | (2006.01) | |
| H04L 25/00 | (2006.01) | |
| H04L 25/40 | (2006.01) | |

(52) U.S. Cl. ......... 375/371; 375/317; 375/356; 375/357
(58) Field of Classification Search ............... 375/316, 375/317, 346, 349, 354, 359–361, 371, 373, 375/375–376
See application file for complete search history.

(56) References Cited

U.S. PATENT DOCUMENTS

| | | | |
|---|---|---|---|
| 4,823,360 A | | 4/1989 | Tremblay et al. |
| 5,736,875 A | * | 4/1998 | Sakamoto et al. ............. 327/74 |
| 6,580,763 B1 | | 6/2003 | Müllner et al. |
| 2002/0131531 A1 | * | 9/2002 | Matsumoto et al. .......... 375/340 |
| 2005/0220182 A1 | | 10/2005 | Kuwata |
| 2005/0281355 A1 | * | 12/2005 | Cranford et al. .............. 375/316 |
| 2006/0023825 A1 | | 2/2006 | Kato et al. |

FOREIGN PATENT DOCUMENTS

| | | |
|---|---|---|
| EP | 0 966 117 A1 | 12/1999 |
| JP | 08-265375 | 10/1996 |
| JP | 2006-50102 | 2/2006 |
| WO | 00/11830 | 3/2000 |
| WO | WO 2004/088913 A1 | 10/2004 |

OTHER PUBLICATIONS

European Extended Search Report for 08878747.8, mailed Apr. 2, 2012.

M. Kawai et al., "Smart optical receiver with automatic decision threshold setting and retiming phase alignment", Sep. 10, 1989, pp. 320-323.

* cited by examiner

*Primary Examiner* — David C. Payne
*Assistant Examiner* — James M Perez
(74) *Attorney, Agent, or Firm* — Staas & Halsey LLP

(57) ABSTRACT

A receiving apparatus includes a first receiving circuit that receives an input signal based on a clock signal, and outputs a first output signal, a second receiving circuit that receives the input signal based on the clock signal, and outputs a second output signal, and a comparison circuit that compares value of the first output signal outputted by the first receiving circuit and value of the second output signal outputted by the second receiving circuit.

5 Claims, 13 Drawing Sheets

RECEIVING APPARATUS, TRANSMISSION APPARATUS, AND TRANSMISSION METHOD

CROSS-REFERENCE TO RELATED APPLICATION

This application is a continuation of International Application No. PCT/JP2008/072567, filed on Dec. 11, 2008, the entire contents of which are incorporated herein by reference.

FIELD

An embodiment of the present invention discussed herein is relates to a receiving apparatus, a transmission apparatus, and a transmission method.

BACKGROUND

Figure 10:
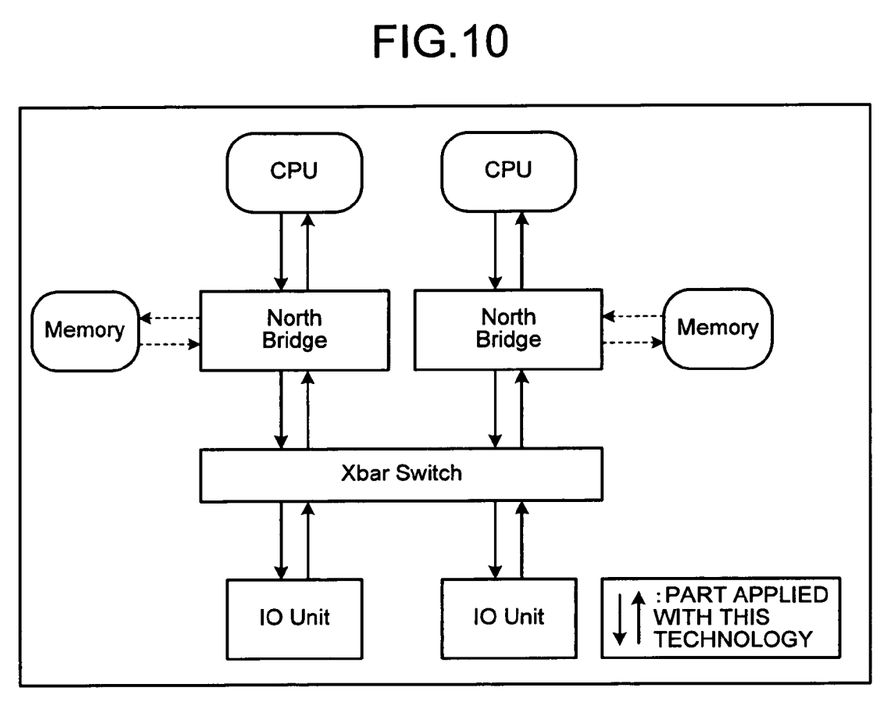
FIG. 10 is a schematic diagram that depicts an example of a transmitting system to which a differential transmission method is applied.

Recently, among data transmission methods, a differential transmission method is mainstream, according to which signals in opposite phases opposite to each other are sent by using two signal lines with respect to certain data, and transmission and reception are performed so as to take a differential between amplitudes of a pair of voltages of the lines as data. For example, as depicted in FIG. 10, a transmission system including the differential transmission technology is configured to be used mainly for transmission between LSI (Large Scale Integrated-circuit) chips, for example, transmission between a CPU (Central Processing Unit) and a North Bridge, and transmission between a North Bridge and a crossbar switch.

Figure 11:
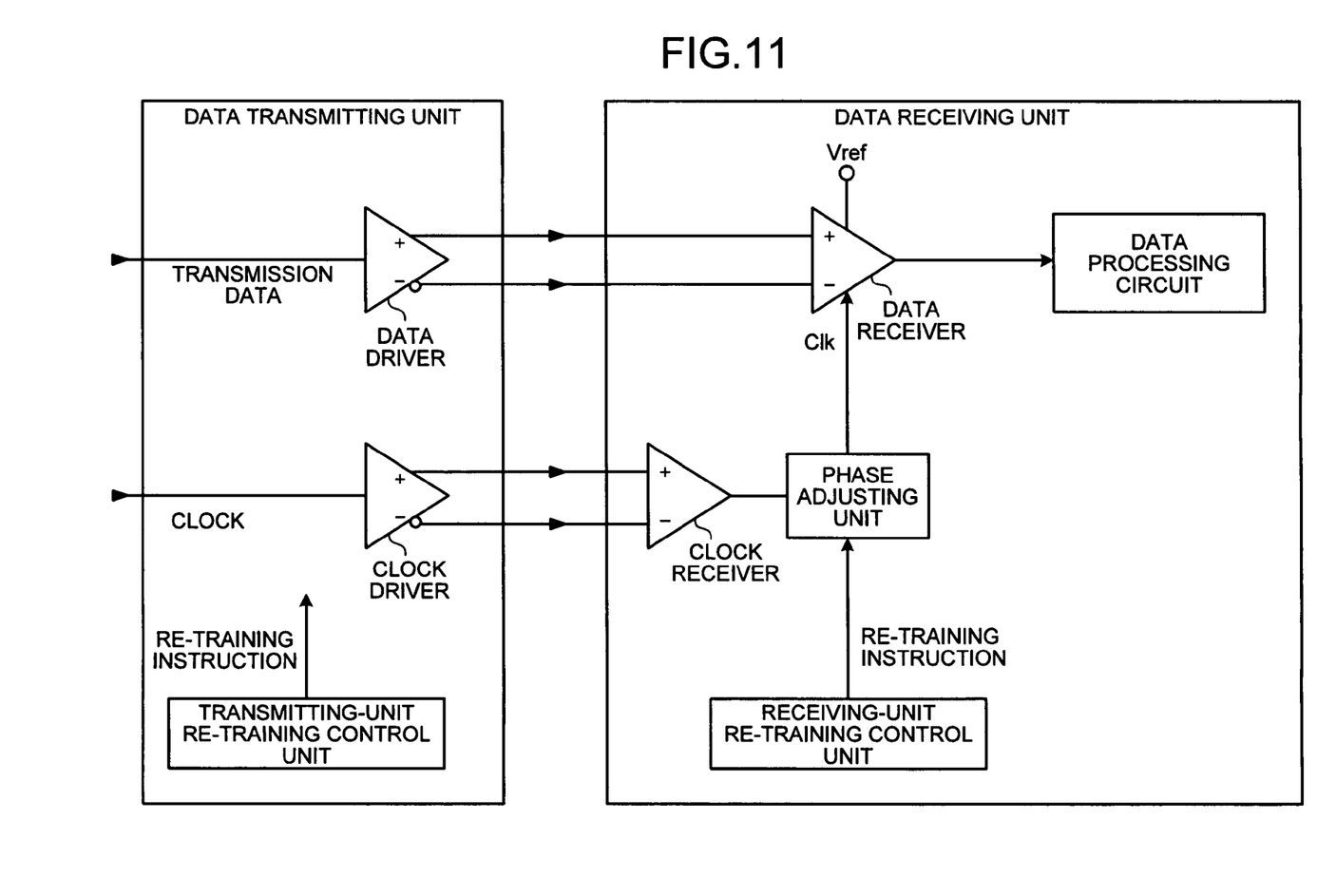
FIG. 11 is a schematic diagram that depicts a configuration of a data transmission apparatus using a conventional technology.

According to such differential transmission method, as depicted in FIG. 11, a data transmitting unit includes a data driver that transmits a differential signal and outputs data, and a data receiving unit includes a data receiver that receives a differential signal and takes out data. Moreover, the data receiving unit includes a phase adjusting circuit for adjusting a received clock phase to a position appropriate to data.

A general view of a conventional transmission system is depicted in FIG. 11. As depicted in the figure, according to the conventional method, transmission data and a clock synchronized with the data are output as voltage signals from a data driver and a clock driver of the data transmitting unit, and detected by a data driver and a clock receiver of the data receiving unit. When the clock receiver receives the clock, the clock receiver adjusts the clock phase to a phase that is determined by a re-training operation described later, and inputs it into the data receiver as a reception clock. The data receiver captures a voltage value with an input clock cycle as 0/1 data, and outputs it into the inside of the circuit.

Figure 12:
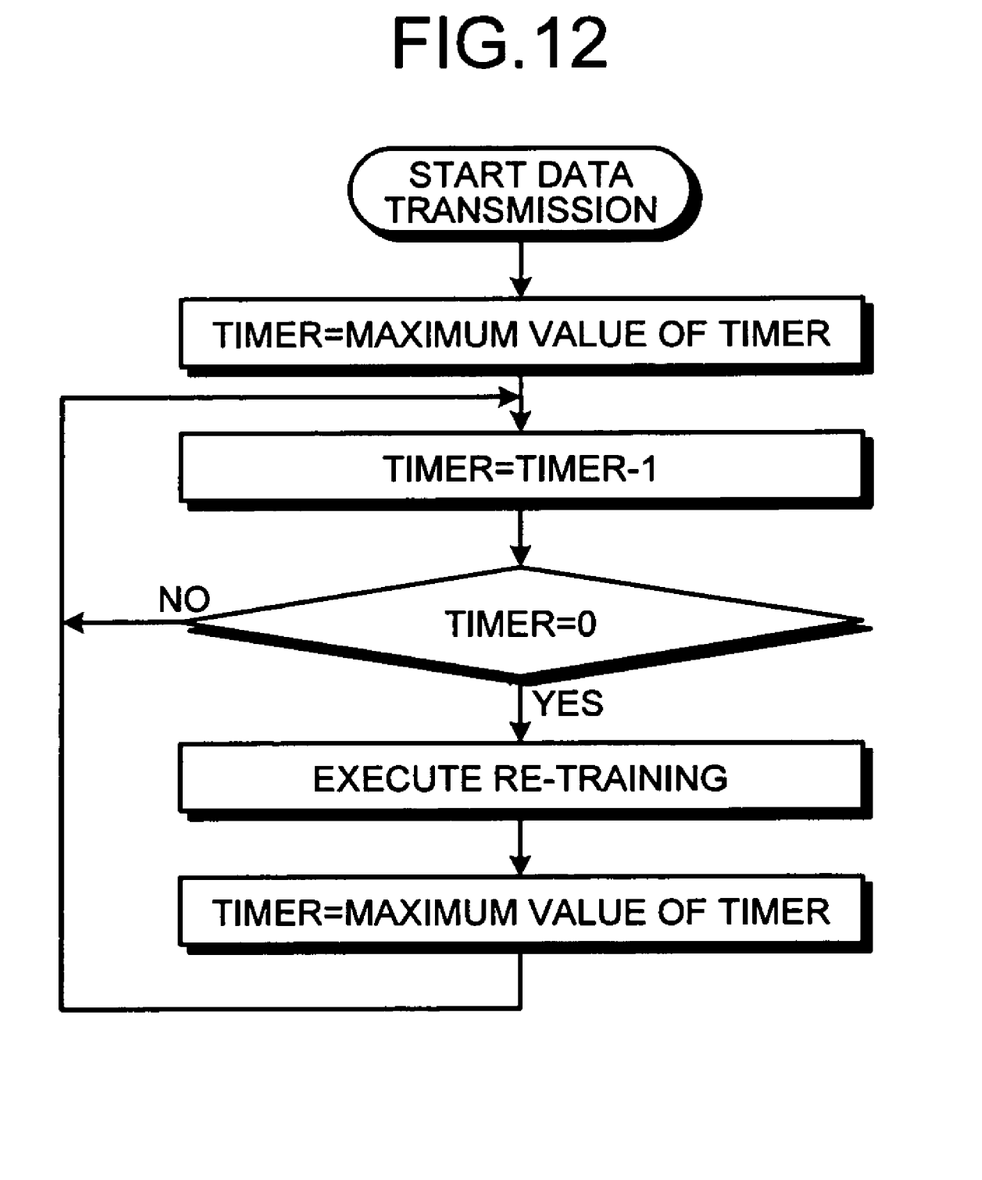
FIG. 12 is a schematic diagram for explaining a re-training operation according to the conventional technology.
Figure 13:
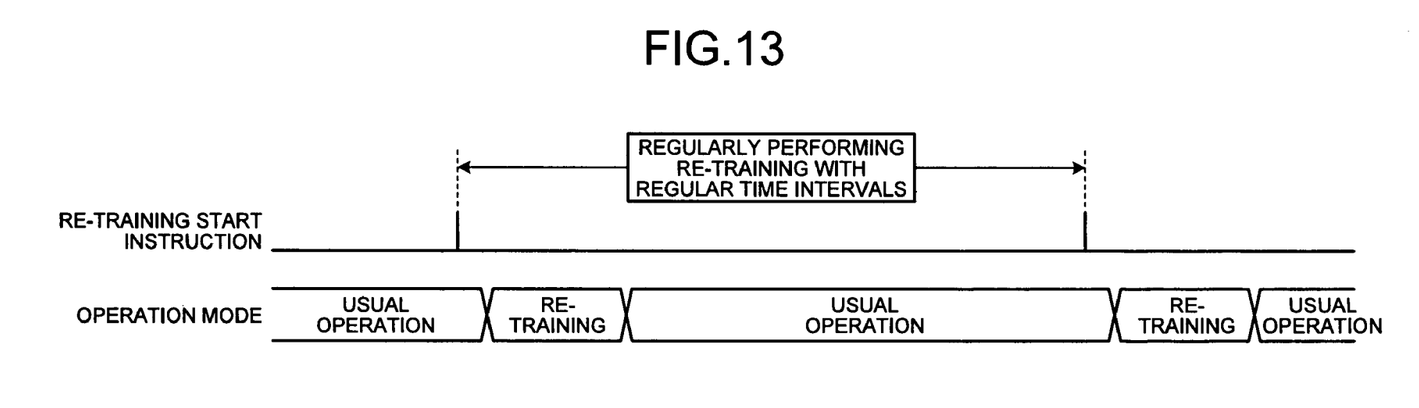
FIG. 13 is a schematic diagram for explaining re-training operation timing according to the conventional technology.

Moreover, the data transmitting unit and the data receiving unit perform with a certain frequency a re-training operation of adjusting the phase by using a known data pattern so as to bring the edge position of the clock received by the data receiving unit to an appropriate position that is appropriate to reception data so that, for example, requirements of setup time and hold time are satisfied. FIGS. 12 and 13 depict a flowchart and a timing chart of a re-training operation. The re-training is controlled by respective re-training control units of the data transmitting unit and the data receiving unit.

Each of the re-training units measures time with a timer during usual operation, and asserts a re-training instruction signal after the elapse of a certain time. Here, the timers are synchronized between the data transmitting unit and the data receiving unit, and the data transmitting unit and the data receiving unit shift to the re-training operation with the same timing. During the re-training, data reception is tried by changing the clock with the phase adjusting circuit of the data receiving unit, and the clock phase is fixed to a position at which a data pattern can be correctly received.

Figure 14:
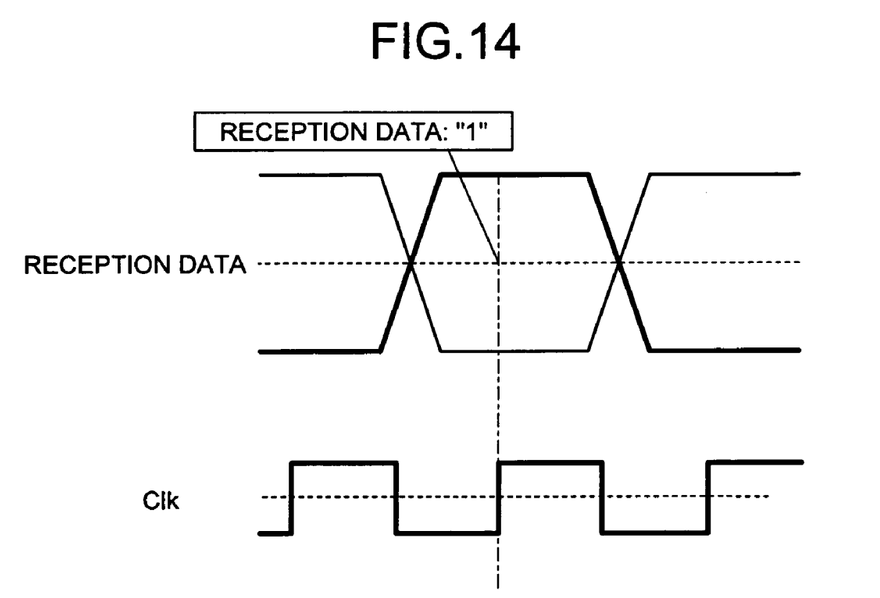
FIG. 14 is a schematic diagram for explaining a data receiving operation (normal state) according to the conventional technology.

A state of data reception by the data receiver is depicted in FIG. 14. Reception data appears as a voltage variation that continuously rises and falls, as depicted as a wave form in the upper part of the figure. With respect to the voltage variation, data is captured at a point at which the reception clock depicted in the lower part in the figure changes from 0 to 1, and data is defined to "0" or "1".

At that time, a reference value for determining 0/1 of the data is determined in accordance with a receiving threshold voltage (Vref) of the data receiver. If the phase of the reception clock is appropriately adjusted to the variation in the received voltage, data capturing is performed in a range in which the received voltage is beyond a receiving threshold and sufficiently stable, so that correct data is output.

Figure 15:
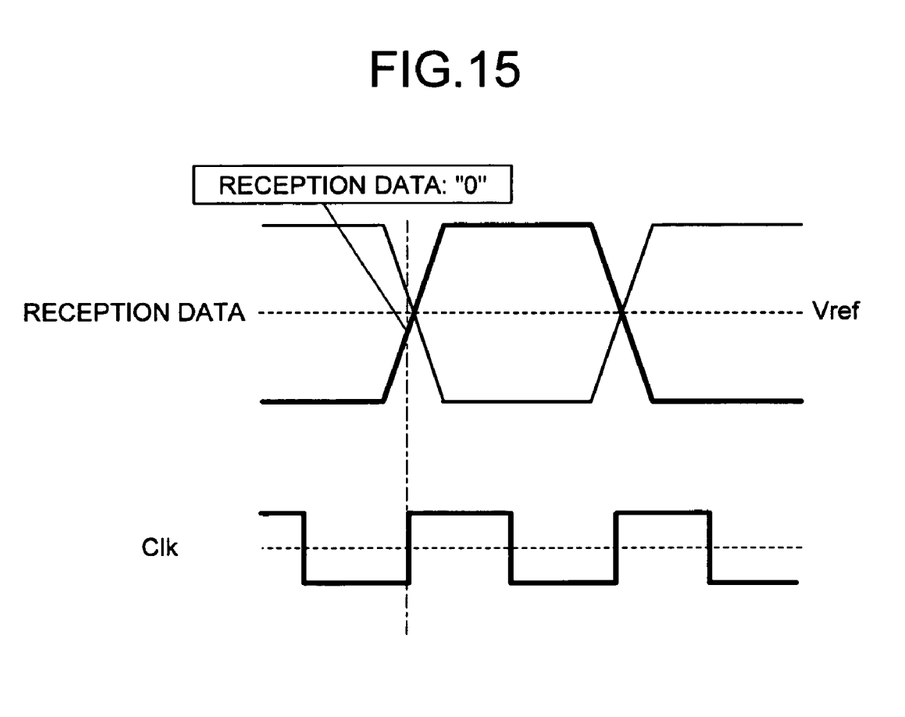
FIG. 15 is a schematic diagram for explaining a data receiving operation (failure state) according to the conventional technology.

A state in a case where a data receiver fails in data reception is depicted in FIG. 15. When a data capturing point is close to the vicinity of a point at which the voltage variation passes through the receiving threshold, the data receiver fails in data reception, and output an incorrect value.

There is a problem that the conventional transmission method has no means of detecting phase relation between a clock and data, and cannot confirm whether data is correctly received. Moreover, there is another problem that when a phase adjustment of a receiving clock is failed, and a data capturing position is inappropriately close to a data edge, such situation cannot be detected.

Patent Document 1: Japanese Laid-open Patent Publication No. 2006-050102

Patent Document 2: International Publication Pamphlet No. WO 2004/088913

SUMMARY

According to an aspect of an embodiment, a receiving apparatus includes a first receiving circuit that receives a first signal and outputs a second signal; a second receiving circuit that has a receiving ability different from a receiving ability of the first receiving circuit, receives the first signal, and outputs a third signal; and a comparison circuit that compares the second signal output by the first receiving circuit and the third signal output by the second receiving circuit.

According to another aspect of an embodiment, a transmission apparatus that includes a transmitting apparatus that transmits a first signal, and a receiving apparatus that receives the first signal via a transmission channel, wherein the transmitting apparatus includes a transmitting circuit that transmits the first signal, and the receiving apparatus includes a first receiving circuit that receives the first signal and outputs a second signal, a second receiving circuit that has a receiving ability different from a receiving ability of the first receiving circuit, receives the first signal, and outputs a third signal, and a comparison circuit that compares the second signal output by the first receiving circuit and the third signal output by the second receiving circuit.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings.

[a] First Embodiment

The following embodiment explains a principle of a data transmission apparatus according to a first embodiment, a configuration of the data transmission apparatus, and a flow of processing in order, and finally explains effects according to the first embodiment.

Principle of Data Transmission Apparatus According to First Embodiment

Figure 1:
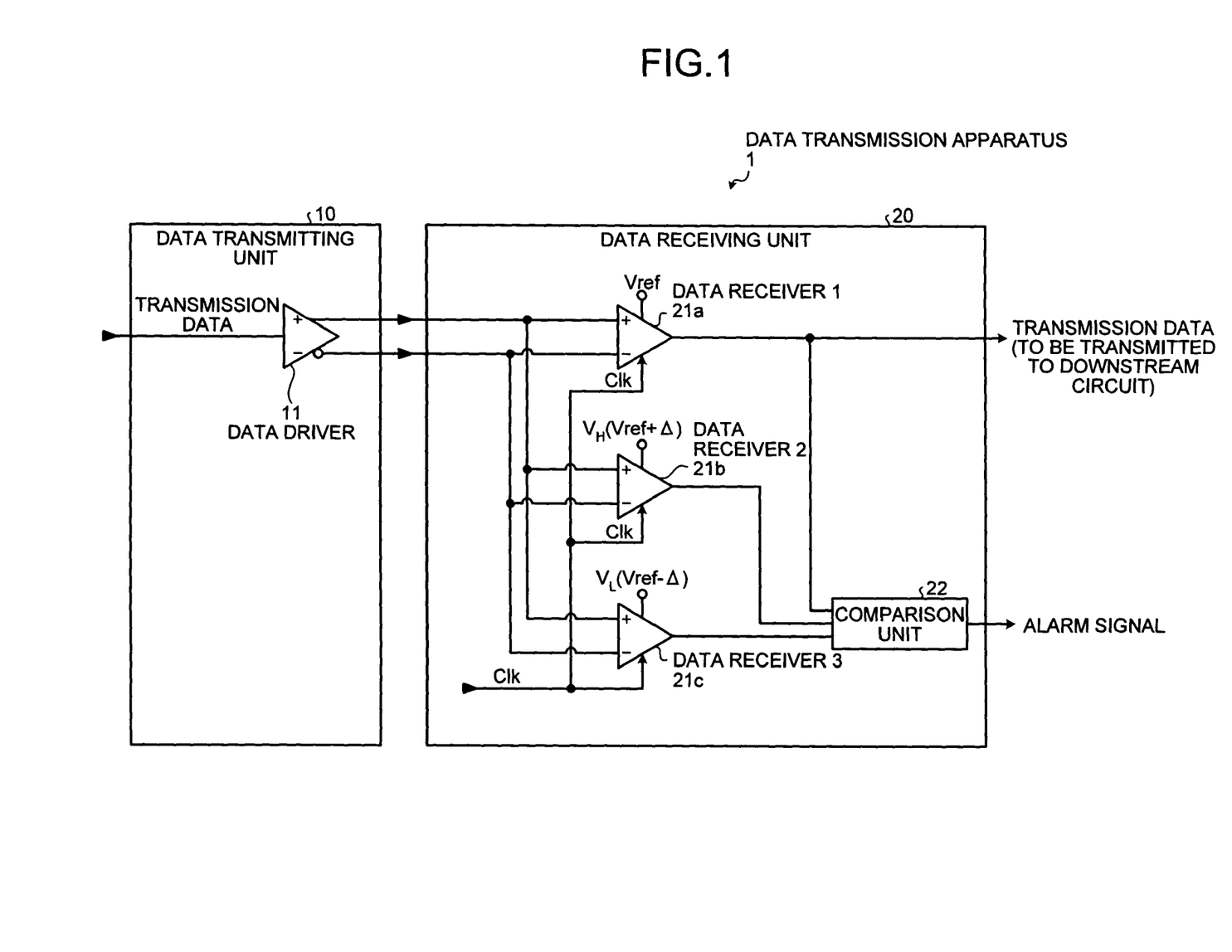
FIG. 1 is a schematic diagram for explaining a principle of a data transmission apparatus according to a first embodiment.

First of all, a principle of the data transmission apparatus according to the first embodiment is explained below with reference to FIG. 1. FIG. 1 is a schematic diagram for explaining a principle of the data transmission apparatus according to the first embodiment.

A data transmission apparatus 1 according to the first embodiment includes a data transmitting unit 10 that outputs transmission data and a clock synchronized with the data to a data receiving unit 20 as a voltage signal, and the data receiving unit 20 that receives the transmission data transmitted from the data transmitting unit 10 and the clock synchronized with the data.

Under such configuration, as depicted in FIG. 1, the data transmission apparatus 1 is provided with a data receiver "1" to be used as a usual receiving circuit, and additionally a receiver "2" that has a receiving threshold voltage higher than usual, and a receiver "3" that has a receiving threshold voltage lower than usual, all of which are provided in the data receiving unit 20 in parallel, receives data with all of the data receivers "1" to "3", and compares outputs of those.

When the three data receivers output the same value, the data transmission apparatus 1 determines that there is a sufficient allowance in the phases, and continues a usual operation. By contrast, when any one of a data receiver with a high receiving threshold voltage and a data receiver with a low receiving threshold voltage returns a value different from the other two, the data transmission apparatus 1 determines that a phase difference between a clock edge and a data edge is little, and gives notice of an alarm signal that gives the alarm.

Specifically, the data transmission apparatus 1 compares output signals received from data receivers 21a to 21c by a comparison unit 22, respectively, and the data transmission apparatus 1 determines whether all output signals received from the data receivers 21a to 21c are resulted to 0 or 1. As a result, if the output signals of the three receivers are not all "0" or all "1", the comparison unit 22 makes an alarm signal "1" for the alarm.

In this way, when the edge of reception data comes close to the edge of the clock, the data transmission apparatus 1 can detect such situation, and can avoid a data garble by stopping operation before failing in data reception. Moreover, it can be controlled so as to keep an appropriate receiving state by re-executing a phase adjustment, so that reliability at the time of data transmission is improved.

Configuration of Data Transmission Apparatus

Figure 2:
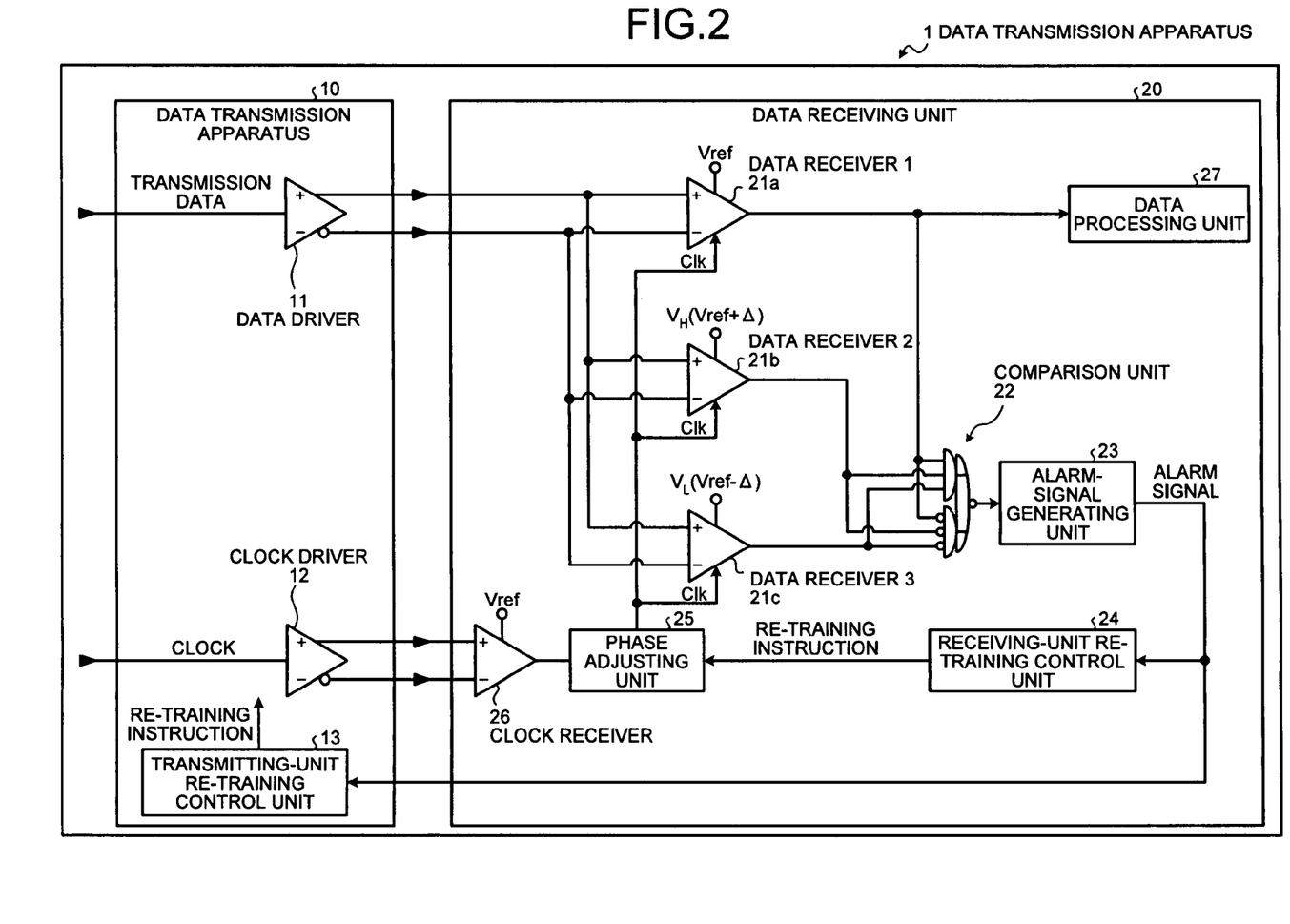
FIG. 2 is a block diagram that depicts a configuration of the data transmission apparatus according to the first embodiment.
Figure 3:
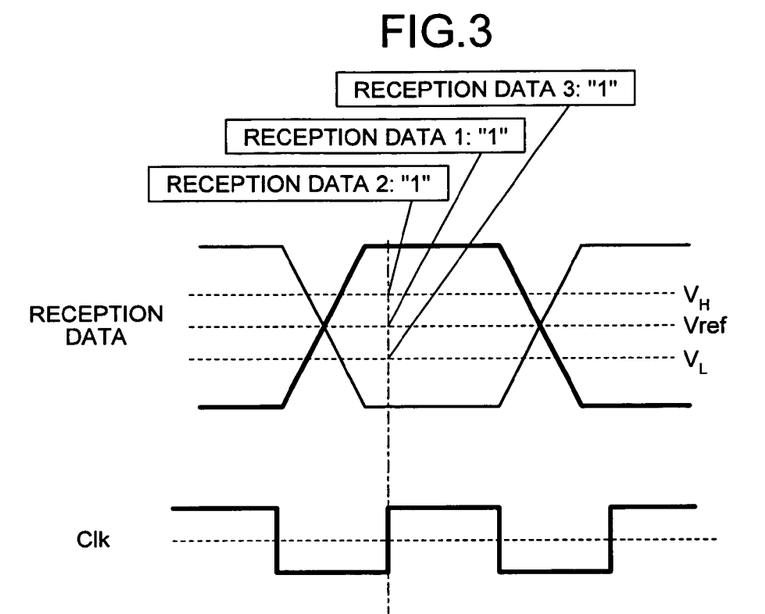
FIG. 3 is a schematic diagram for explaining a data receiving operation (normal state)
Figure 4:
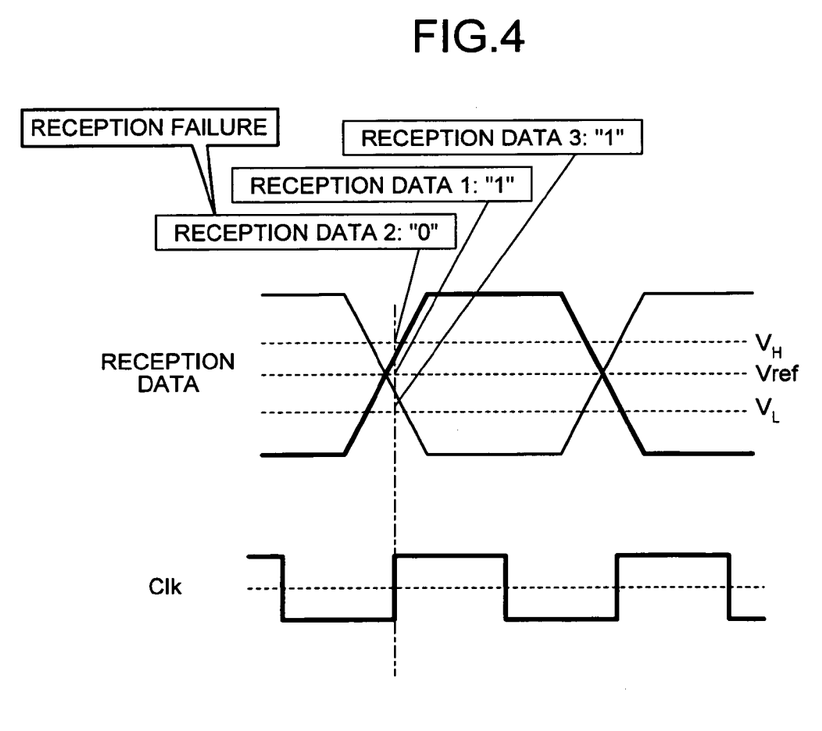
FIG. 4 is a schematic diagram for explaining a data receiving operation (alarm notification state)
Figure 5:
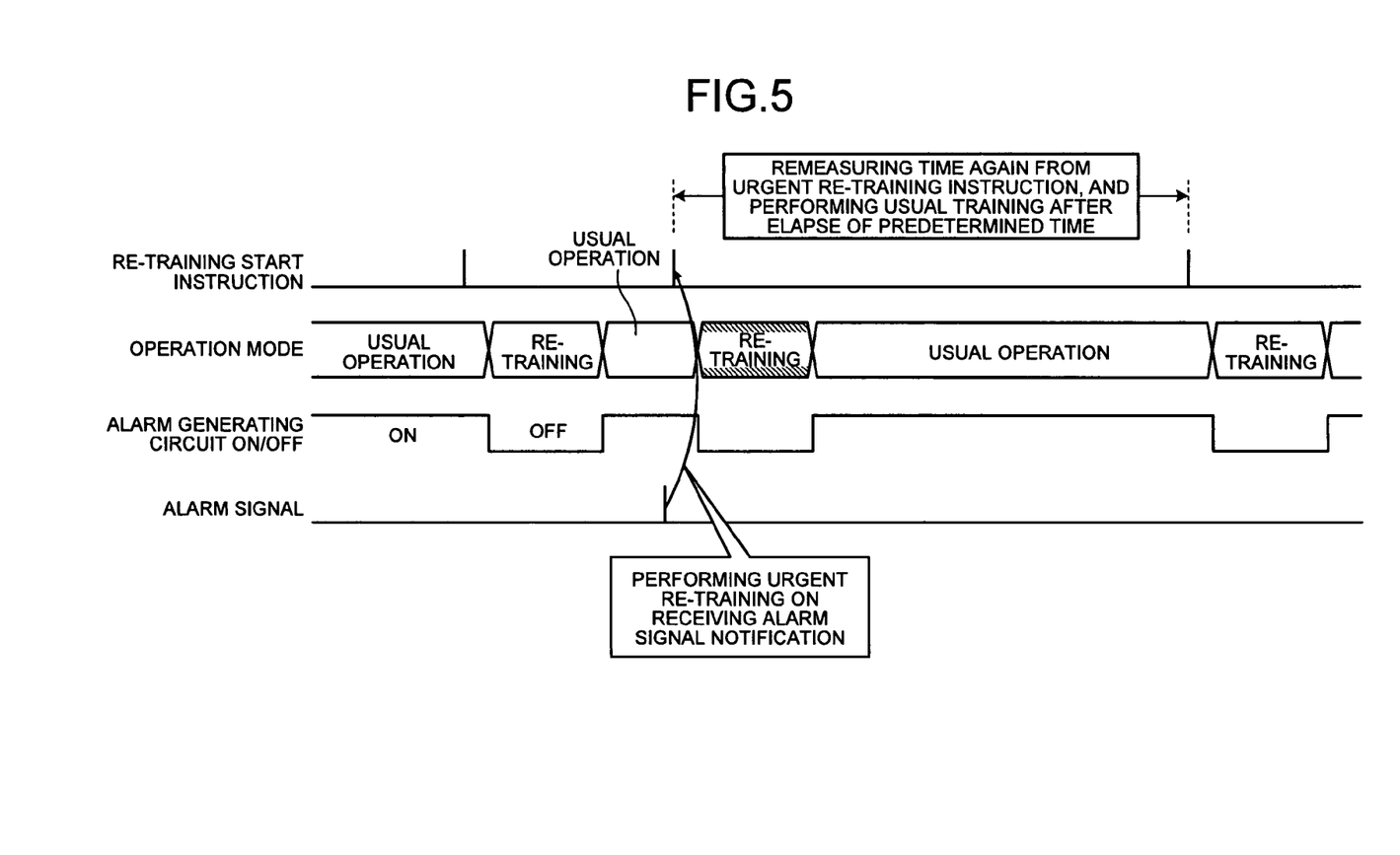
FIG. 5 is a schematic diagram for explaining re-training operation timing.
Figure 6:
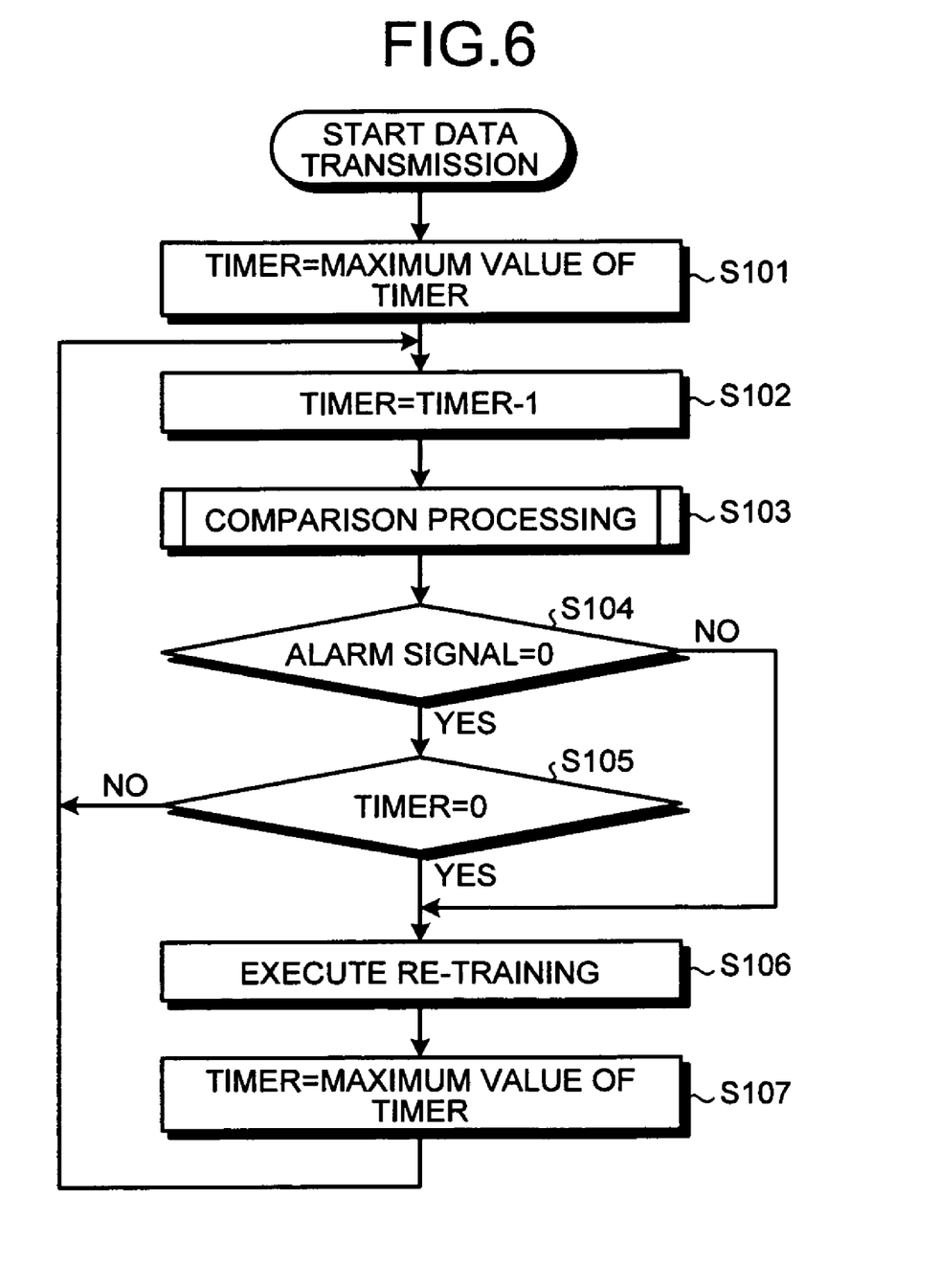
FIG. 6 is a flowchart for explaining a procedure of re-training processing by the data transmission apparatus according to the first embodiment.

A configuration of the data transmission apparatus 1 depicted in FIG. 1 is explained below with reference to FIGS. 2 to 6. FIG. 2 is a block diagram that depicts a configuration of the data transmission apparatus 1 according to the first embodiment. FIG. 3 is a schematic diagram for explaining a data receiving operation (normal state). FIG. 4 is a schematic diagram for explaining a data receiving operation (alarm notification state). FIG. 5 is a schematic diagram for explaining re-training operation timing. FIG. 6 is a flowchart for explaining a procedure of re-training processing by the data transmission apparatus according to the first embodiment.

As depicted in the figure, the data transmission apparatus 1 includes the data transmitting unit 10 and the data receiving unit 20, and the data transmitting unit 10 and the data receiving unit 20 are connected to each other via signal lines. Processing by each of the units is explained below.

The data transmitting unit 10 outputs transmission data and a clock synchronized with the data to the data receiving unit 20 as a voltage signal, and particularly includes a data driver 11, a clock driver 12, and a transmitting-unit re-training control unit 13.

The data driver 11 converts transmission data to be transmitted into a differential signal, and outputs it to a pair of signal lines. The data driver 11 then transmits the transmission data to the data receivers 21a to 21c of the data receiving unit 20.

The clock driver 12 converts a clock signal synchronized with transmission data into a differential signal, and outputs it to the pair of the signal lines. The clock driver 12 then transmits the clock signal to a clock receiver 26 of the data receiving unit 20.

The transmitting-unit re-training control unit 13 outputs a re-training instruction signal with regular time intervals, and controls the start or the termination of a re-training operation.

The data receiving unit 20 receives transmission data transmitted from the data transmitting unit 20 and a clock synchronized with the data, and particularly includes the data receivers 21a to 21c, the comparison unit 22, an alarm-signal generating unit 23, a receiving-unit re-training control unit 24, a phase adjusting unit 25, and the clock receiver 26, and a data processing unit 27.

The data receivers 21a to 21c are data receivers having respective different receiving abilities, and receive transmission data transmitted from the data driver. Specifically, the data receivers 21a to 21c take a differential in voltage variations appearing in the pair of the signal lines, and reconstruct it as data. At that time, the data receivers 21a to 21c need to receive input of a clock that is adjusted by the phase adjusting unit 25 into a phase appropriate to transmission data from a clock signal received by the clock receiver 26 described later, and input of a reference voltage (receiving threshold voltage) in accordance with which a voltage value is converted into 0/1.

A receiving threshold voltage of each of the data receivers 21a to 21c is explained below. The data receiver 21a performs data reception by being driven with a receiving threshold voltage (a receiving threshold voltage similar to that to be input according to conventional technologies) Vref, which is appropriately adjusted for the data reception. The data receiver 21b performs data reception by being driven with a receiving threshold voltage VH that is slightly higher than the receiving threshold voltage of the data receiver 21a. The data receiver 21c performs data reception by being driven with a receiving threshold voltage VL that is slightly lower than the receiving threshold voltage of the data receiver 21a.

Operations of the respective data receivers when receiving data are explained below with reference to FIGS. 3 and 4. As depicted in FIG. 3, when the data receivers 21a to 21c are under a normal data-reception state, any of the data receivers detects a voltage that is beyond the receiving threshold voltage and stable, and outputs the same value. Under such state, the alarm-signal generating unit 23 described later outputs "0".

By contrast, as depicted in FIG. 4, when the clock is close to a data edge with respect to the data receivers 21a to 21c, the data receiver 21b or the data receiver 21c captures data by striding the receiving threshold voltage, thereby outputting a different value to the comparison unit 22 differently from the other two receivers. Under such state, the alarm-signal generating unit 23 outputs "1", and can detect that the clock is in the vicinity of a data edge.

After that, each of the data receivers 21a to 21c reconstructs data, and then inputs the reconstructed data into the comparison unit 22. Moreover, the data receiver 21a inputs the reconstructed data also into the data processing unit 27.

The comparison unit 22 makes a comparison to determine whether output signals output from the respective data receivers are the same output signal. Specifically, the comparison unit 22 compares the output signals received from the data receivers 21a to 21c, determines whether all of the output signals are 0, or 1, and notifies the alarm-signal generating unit 23 of a determination result.

When the output signals output from the respective data receivers are not the same output signal, the alarm-signal generating unit 23 generates an alarm signal as the alarm. Specifically, the alarm-signal generating unit 23 received a determination result from the comparison unit 22; and if it is determined that the output signals of the data receivers 21a to 21c are all 0, or 1, the alarm-signal generating unit 23 inputs "0" into the transmitting-unit re-training control unit 13 and the receiving-unit re-training control unit 24.

If it is determined that the output signals of the data receivers 21a to 21c are not all 0, or 1, the alarm-signal generating unit 23 inputs "1" (i.e., an alarm signal) into the transmitting-unit re-training control unit 13 and the receiving-unit re-training control unit 24.

In other words, when the alarm-signal generating unit 23 outputs "1" as an alarm signal, the respective re-training control units 13 and 24 of the data transmitting unit 10 and the data receiving unit 20 immediately execute urgent re-training regardless of a cycle of usual re-training. According to such process, a risk of failure in data reception and resulting malfunction of the circuit can be detected in advance, and can be avoided by performing re-training as a countermeasure.

The receiving-unit re-training control unit 24 outputs a re-training instruction signal to the phase adjusting unit 25 with regular time intervals, and controls the start or the termination of a re-training operation. Moreover, when an alarm signal from the alarm-signal generating unit 23 is received, the receiving-unit re-training control unit 24 performs control so as to execute urgent re-training.

Timing of a re-training operation including control with an alarm signal is explained below with reference to FIG. 5. As depicted in the figure, the re-training control units 13 and 24 of the data transmitting unit 10 and the data receiving unit 20 perform re-training with regular time intervals by measuring time with a timer similarly to conventional technologies in a usual state; however, when an alarm signal from the alarm-signal generating unit 23 is received, the re-training control units 13 and 24 execute re-training regardless of time. After the training is completed, the re-training control units 13 and 24 initialize the timer, and return to re-training processing with regular time intervals.

The phase adjusting unit 25 adjusts the clock phase so as to fit an edge position of a received clock to the center of reception data. Specifically, the phase adjusting unit 25 adjusts the clock phase of a clock output from the clock receiver 26 so as to fit the edge position of the clock, for example, to the center of reception data, to satisfy requirements of setup time and hold time, and inputs it into each of the data receivers 21a to 21c.

The clock receiver 26 takes a differential of the voltage variations appearing in the pair of the signal lines, and reconstructs it as a clock. The data processing unit 27 performs arithmetic processing, processing of storing data, and the like, by using output of the data receiver 21a.

Processing by Data Transmission Apparatus

Figure 7:
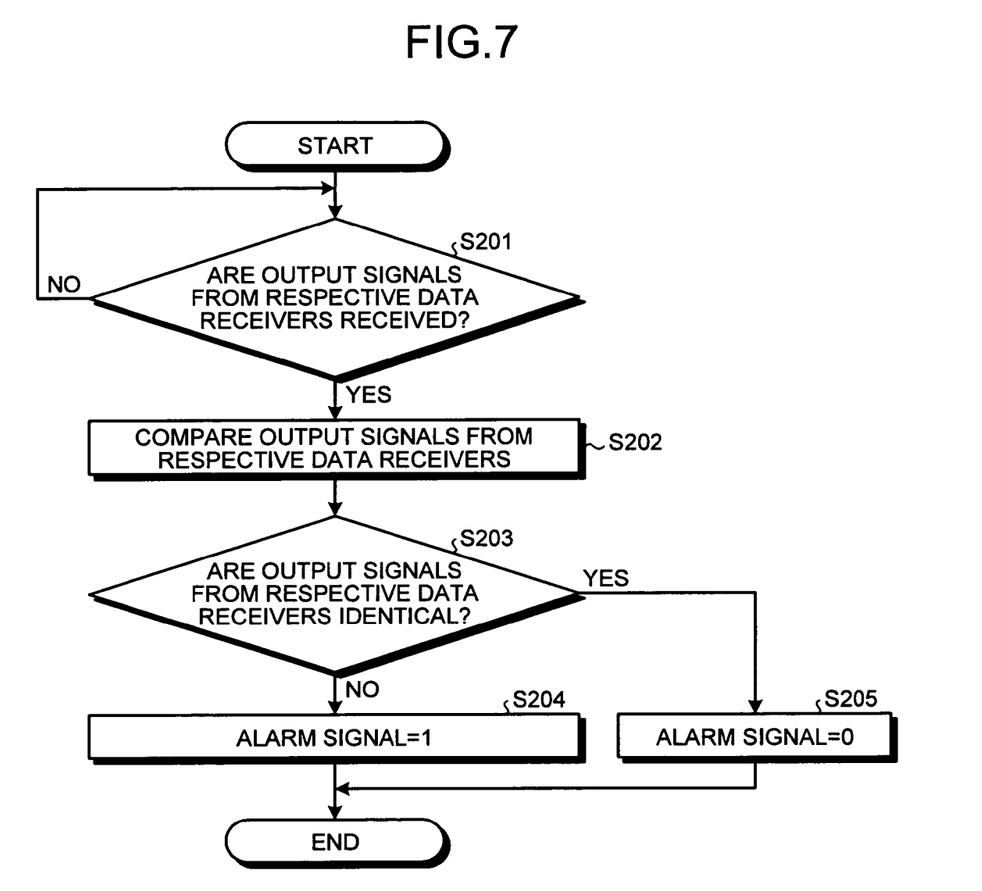
FIG. 7 is a flowchart for explaining a procedure of comparison processing by the data transmission apparatus according to the first embodiment.

Processing by the data transmission apparatus 1 according to the first embodiment is explained below with reference to FIGS. 6 and 7. FIG. 6 is a flowchart for explaining a procedure of re-training processing by the data transmission apparatus according to the first embodiment. FIG. 7 is a flowchart for explaining a procedure of comparison processing by the data transmission apparatus according to the first embodiment.

As depicted in FIG. 6, the data transmission apparatus 1 sets the value of the timer to the maximum value at first (Step S101); and subtracts one by one from the set value of the timer (Step S102). The data transmission apparatus 1 then performs comparison processing of making a comparison to determine whether output signals output from the respective data receivers are the same output signal (which will be described later in detail with reference to FIG. 7) (Step S103). After that, as a result of the comparison processing, when an alarm signal "1" is output from the alarm-signal generating unit 23 (No at Step S104); the data transmission apparatus 1 executes re-training regardless of time (Step S106).

By contrast, when an alarm signal "0" is output from the alarm-signal generating unit 23 (Yes at Step S104); the data transmission apparatus 1 determines whether the timer is at 0 (Step S105). As a result, if the timer is not at 0 (No at Step S105); the data transmission apparatus 1 returns to S102, and repeats the processing of subtracting from the value of the timer.

By contrast, if the timer is at 0 (Yes at Step S105); the data transmission apparatus 1 determines that a predetermined time has elapsed, and executes re-training (Step S106). After that, the data transmission apparatus 1 returns the value of the timer to the maximum value (Step S107), and goes back to S102 and repeats the above processing.

The comparison processing by the data transmission apparatus 1 is explained below with reference to FIG. 7. As depicted in the figure, when each of the data receivers 21a to 21c receives transmission data transmitted from the data driver 11 (Step S201); the data transmission apparatus 1 makes a comparison to determine whether output signals output from the respective data receivers are the same output signal (Step S202).

As a result, if the output signals output from the respective data receivers are not the same output signal (No at Step S203); the data transmission apparatus 1 outputs an alarm signal "1" from the alarm-signal generating unit 23 (Step S204). By contrast, if the output signals output from the respective data receivers are the same output signal (Yes at Step S203); the data transmission apparatus 1 does not output the alarm signal "1", and terminates the processing.

Effects of First Embodiment

As described above, the data transmission apparatus 1 includes the data receivers 21a to 21c having different receiving abilities, receives data by using the data receivers 21a to 21c, and makes a comparison to determine whether respective output signals output from the data receivers 21a to 21c are the same output signal. Accordingly, when a data capturing position comes close to a data edge in a data receiving circuit, such situation can be appropriately detected.

Moreover, according to the first embodiment, when respective output signals output from the data receivers 21a to 21c are not the same output signal, the data transmission apparatus 1 generates an alarm signal as the alarm; and when an alarm signal is generated, the data transmission apparatus 1 executes re-training of adjusting the phase. Accordingly, it can be controlled so as to obtain an appropriate receiving state by re-executing a phase adjustment when an edge of reception data comes close to an edge of the clock, thereby being capable to improve reliability at the time of data transmission. Furthermore, by using a detection result for control as an alarm signal, malfunction due to a failure in data reception can be prevented from occurring.

As the plurality of data receivers 21a to 21c having respective different receiving abilities, the data receiver 21a that is driven with a predetermined receiving threshold voltage, the data receiver 21b that is driven with a receiving threshold voltage higher than the predetermined receiving threshold voltage, and the data receiver 21c that is driven with a receiving threshold voltage lower than the predetermined receiving threshold voltage, are used and data is received. Accordingly, when a data capturing position comes close to a data edge in a data receiving circuit, such situation can be appropriately detected.

[b] Second Embodiment

Although the first embodiment described above explains a case where a receiving threshold voltage of a data receiver is fixed; however, the embodiment is not limited to this, and can be configured to set selectively a receiving threshold voltage of a data receiver.

Figure 8:
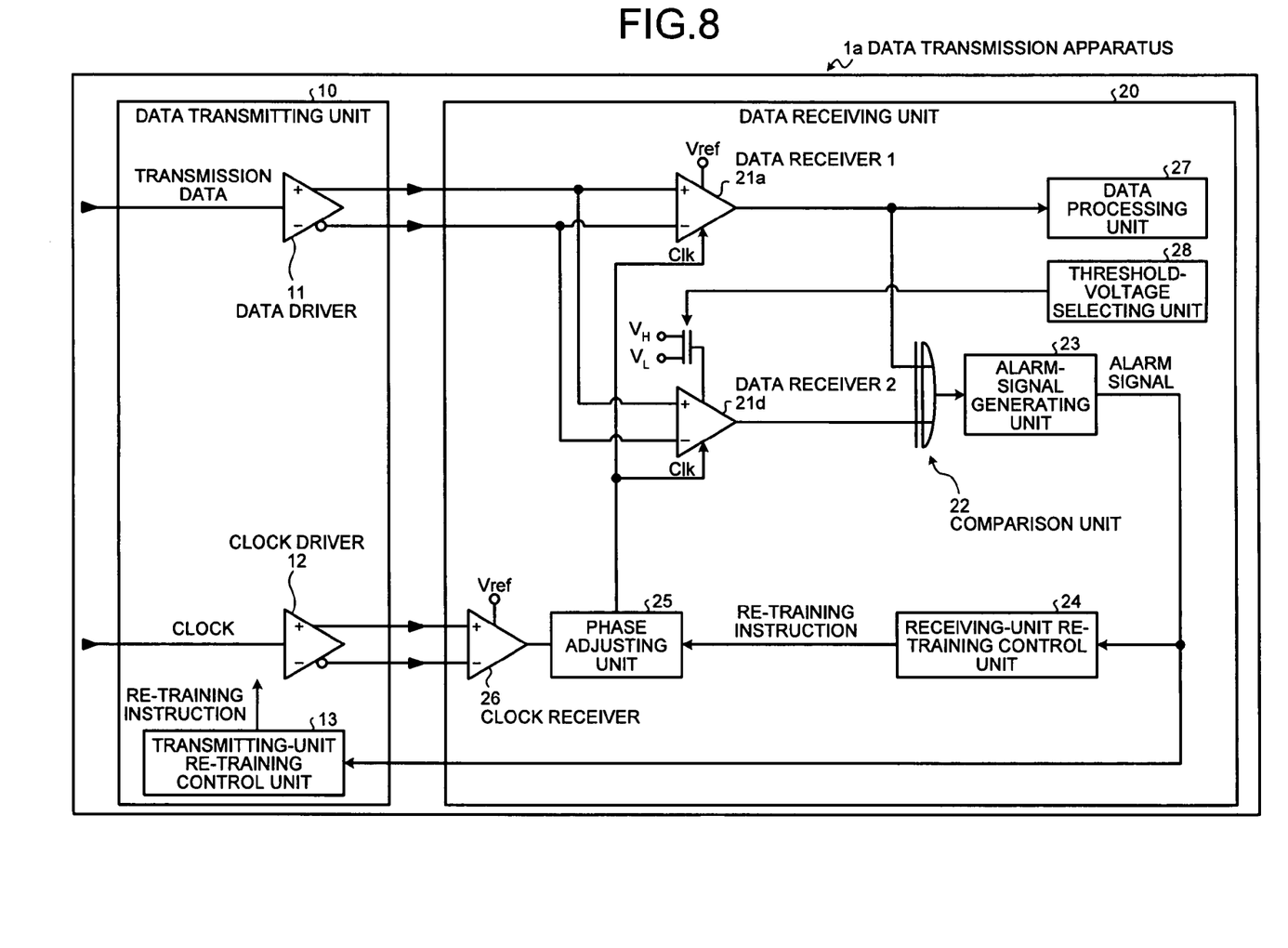
FIG. 8 is a block diagram that depicts a configuration of a data transmission apparatus according to a second embodiment.
Figure 9:
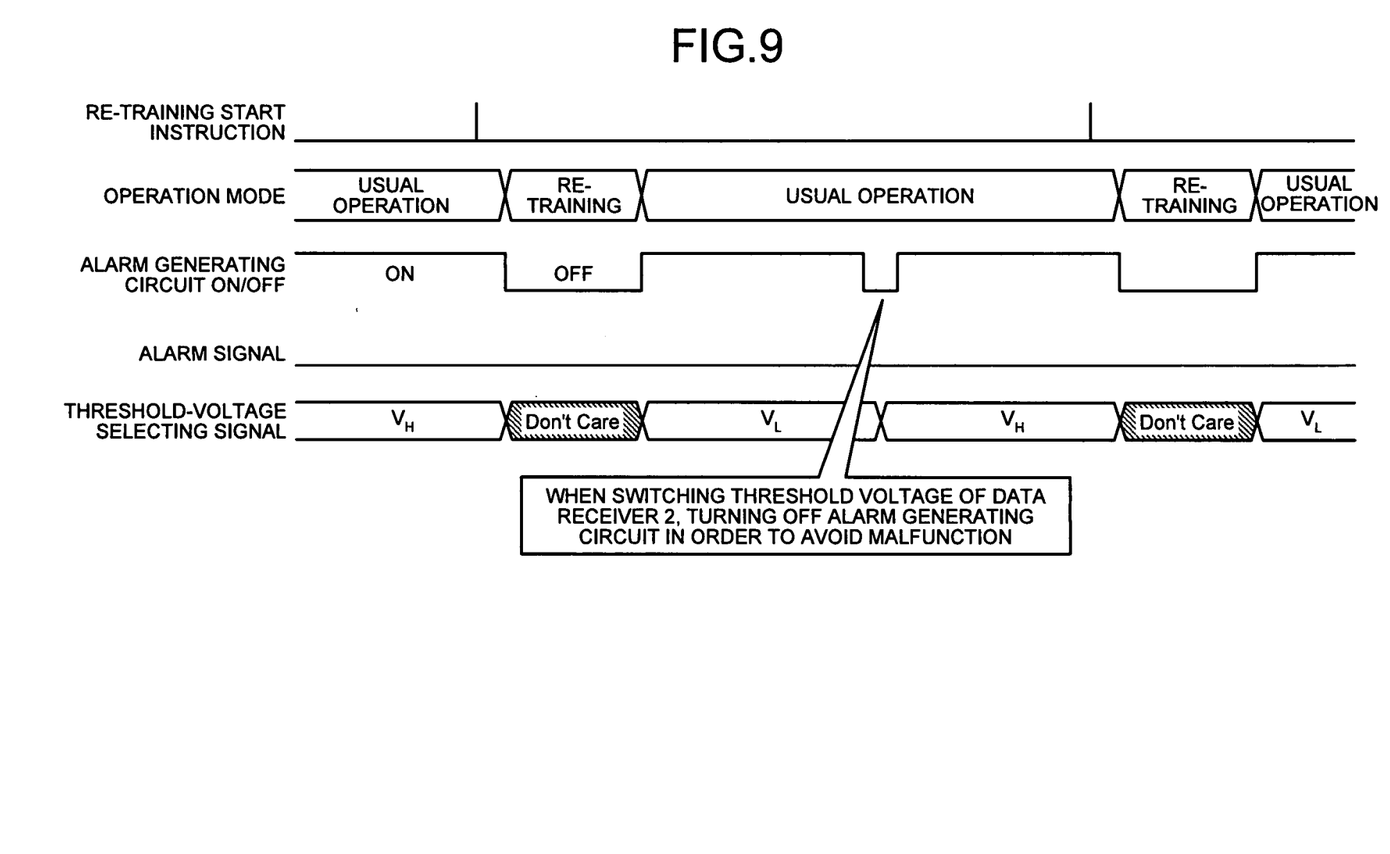
FIG. 9 is a schematic diagram for explaining receiving threshold-voltage switching-operation timing.

Therefore, a second embodiment in the following description explains a configuration and processing of a data transmission apparatus 1a according to the second embodiment with reference to FIGS. 8 and 9, as a case where two data receivers are included, and a receiving threshold voltage of a data receiver is to be selectively set. FIG. 8 is a block diagram that depicts a configuration of a data transmission apparatus according to the second embodiment. FIG. 9 is a schematic diagram for explaining receiving threshold-voltage switching-operation timing.

As depicted in FIG. 8, the data transmission apparatus 1a newly includes a receiving threshold-voltage selecting unit 28 that selects and sets a receiving threshold voltage of a data receiver 21d. Moreover, according to the data transmission apparatus 1a, data receivers of the data receiving unit 20 are two; the data receiver 21a is set with a receiving threshold voltage appropriate to data reception equivalent to that of a conventional technology; and one of a receiving threshold voltage slightly higher or a receiving threshold voltage slightly lower than the receiving threshold voltage of the data receiver 21a is selected and set into the data receiver 21d.

Furthermore, according to the data transmission apparatus 1a, the comparison unit 22 provided downstream of the data receivers 21a and 21d compares output signals of the respective data receivers 21a and 21d; and when the values are different from each other, the alarm-signal generating unit 23 outputs an alarm signal. The other points than the above are equal to the first embodiment.

The data receiver 21d performs data reception by being driven with a receiving threshold voltage VH that is slightly higher than the receiving threshold voltage of the data receiver 21a, or a receiving threshold voltage VL that is slightly lower. The threshold-voltage selecting unit 28 selects one of the receiving threshold voltage VH or the receiving threshold voltage VL as a receiving threshold voltage to be set into the data receiver 21d.

Similarly to the first embodiment, when output signals output from the respective data receivers are not the same output signal, the alarm-signal generating unit 23 generates an alarm signal; and according to the second embodiment, when switching the receiving threshold voltage of the data receiver 21d, the alarm-signal generating unit 23 performs processing of turning OFF the alarm-signal creation processing in order to avoid malfunction.

Operation timing related to setting of a receiving threshold voltage of the data receiver 21d is explained below with reference to FIG. 9. As an example is depicted in the figure, during a period from completion of re-training until the start of the next time, the data receiver 21d operates by selecting VL in the first half of the period as the receiving threshold voltage, and selecting VH in the second half. Accordingly, the data receiver 21d can perform the detection operation by the data receivers 21b and 21c according to the first embodiment, by making rounds with one data receiver.

According to this method, detection is performed with only one of VH and VL at any time point, so that data is checked only in one of a rising phase and a falling phase of the data, consequently a detection performance is decreased. However, originally there is a sufficient time between alarm notification and occurrence of a malfunction due to an actual failure in data reception, therefore, the method according to the embodiment has no problem in practice.

In this way, according to the second embodiment, the data transmission apparatus 1a receives data by using the data receiver 21a that is driven with a predetermined receiving threshold voltage, and the data receiver 21d that is driven with a receiving threshold voltage higher or a receiving threshold voltage lower than the predetermined receiving threshold voltage, as a plurality of data receivers having respective different receiving abilities. Accordingly, the data transmission apparatus 1a can reduce a physical volume of circuit elements in the data receiving unit by reducing data receivers. Particularly, when there is a plurality of data lines that transmits and receives data, instead of one data line, the reduction effect is larger.

[c] Third Embodiment

Having been explaining the embodiments, the receiving apparatus, the transmission apparatus, and the transmission method according to the disclosure can be implemented in various different forms in addition to the embodiments described above. Other embodiments included in the present invention are explained below as a third embodiment.

System Configurations and Other Matters

The components of each device depicted in the drawings are conceptual for describing functions, and does not need to be physically configured as depicted in the drawings. In other words, concrete forms of distribution and integration of the units are not limited to those depicted in the drawings, and all or part of the units can be configured to be functionally or physically distributed and integrated in an arbitrary unit depending on various loads and conditions in use. For example, the comparison unit 22 and the alarm-signal generating unit 23 can be integrated. Furthermore, all or an arbitrary part of processing functions performed by the respective units can be implemented by a CPU and a computer program to be analyzed and executed by the CPU, or can be implemented as hardware by wired logic.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A receiving apparatus comprising:
    a first receiving circuit that receives an input signal based on a clock signal, and outputs a first output signal, the first receiving circuit outputting a value of 1 as the first output signal when voltage of the input signal exceeds predetermined first receiving threshold voltage;
    a selecting circuit that exclusively selects and toggles between a receiving threshold voltage which is higher than the predetermined first receiving threshold voltage and a receiving threshold voltage which is lower than the predetermined first receiving threshold voltage, the selected threshold is used as a second receiving threshold voltage, alternately;
    a second receiving circuit that receives the input signal based on the clock signal, and outputs a second output signal, the second receiving circuit outputting a value of 1 as the second output signal when voltage of the input signal exceeds the second receiving threshold voltage selected by the selecting circuit;
    a comparison circuit that compares a value of the first output signal output by the first receiving circuit and a value of the second output signal output by the second receiving circuit; and
    an alarm generation circuit that generates an alarm signal when the comparison circuit determines that the values of the first and second signal outputs are different, wherein the alarm generation circuit is temporarily disabled when the selection circuit toggles the value of the selected second receiving threshold voltage.

2. The receiving apparatus according to claim 1, further comprising a phase-control circuit that supplies the clock signal to the first receiving circuit and the second receiving circuit, and adjusts a phase of the clock signal supplied to the first receiving circuit and the second receiving circuit when the value of the first output signal and the value of the second output signal are not identical.

3. A transmission apparatus comprising:
    a transmitting apparatus that transmits an input signal, and
    a receiving apparatus that receives the input signal via a transmission channel,
    wherein the transmitting apparatus includes a transmitting circuit that transmits the input signal, and
    wherein the receiving apparatus includes:
        a first receiving circuit that receives the input signal based on a clock signal, and outputs a first output signal, the first receiving circuit outputting a value of 1 as the first output signal when voltage of the input signal exceeds predetermined first receiving threshold voltage,
        a selecting circuit that exclusively selects and toggles between a receiving threshold voltage which is higher than the predetermined first receiving threshold voltage and a receiving threshold voltage which is lower than the predetermined first receiving threshold voltage, the selected threshold is used as second receiving threshold voltage, alternately,
        a second receiving circuit that receives the input signal based on the clock signal, and outputs a second output signal, the second receiving circuit outputting a value of 1 as the second output signal when voltage of the input signal exceeds the second receiving threshold voltage selected by the selecting circuit,
        a comparison circuit that compares value of the first output signal output by the first receiving circuit and value of the second output signal output by the second receiving circuit, and
        an alarm generation circuit that generates an alarm signal when the comparison circuit determines that the values of the first and second signal outputs are different, wherein the alarm generation circuit is temporarily disabled when the selection circuit toggles the value of the selected second receiving threshold voltage.

4. The transmission apparatus according to claim 3, wherein the receiving apparatus further includes
    a phase-control circuit that supplies the clock signal to the first receiving circuit and the second receiving circuit, and adjusts phases of the clock signal supplied to the first receiving circuit and the second receiving circuit when the value of the first output signal and the value of the second output signal are not identical.

5. A transmission method by a transmission apparatus that includes a transmitting apparatus that transmits an input signal, and a receiving apparatus that receives the input signal via a transmission channel, the transmission method comprising:
    transmitting the input signal by a transmitting circuit that is included in the transmitting apparatus;
    receiving the input signal by a first receiving circuit that is included in the receiving apparatus;
    receiving the input signal by a second receiving circuit that is included in the receiving apparatus;
    outputting a first output signal by the first receiving circuit, the first output signal being a value of 1 as the first output signal when voltage of the input signal exceeds predetermined first receiving threshold voltage;

selecting and toggling between a receiving threshold voltage which is higher than the predetermined first receiving threshold voltage and a receiving threshold voltage which is lower than the predetermined first receiving threshold voltage, by a selection circuit, where the selected threshold is used as a second receiving threshold voltage, alternately;

outputting a second output signal by the second receiving circuit, the second output signal being a value of 1 as the second output signal when voltage of the input signal exceeds the second receiving threshold voltage selected by the selecting circuit; and comparing value of the first output signal output by the first receiving circuit and value of the second output signal output by the second receiving circuit, by a comparison circuit that is included in the receiving apparatus; and generating an alarm signal, by an alarm generation circuit, when the comparison circuit determines that the values of the first and second signal outputs are different, wherein the alarm generation circuit is temporarily disabled when the selection circuit toggles the value of the selected second receiving threshold voltage.

* * * * *